United States Patent [19]

Takahashi et al.

[11] Patent Number: 5,499,260
[45] Date of Patent: Mar. 12, 1996

[54] SEMICONDUCTOR LASER AND A METHOD FOR FABRICATING THE SAME

[75] Inventors: Yasuhito Takahashi, Hirakata; Ayumu Tsujimura, Takatsuki, both of Japan

[73] Assignee: Matsushita Electric Industrial Co., Ltd., Osaka, Japan

[21] Appl. No.: 282,919

[22] Filed: Jul. 29, 1994

[30] Foreign Application Priority Data

Aug. 4, 1993 [JP] Japan ........................... 5-193423

[51] Int. Cl.⁶ ......................................... H01S 3/18
[52] U.S. Cl. ............................... 372/46; 372/45
[58] Field of Search ....................... 372/46, 45, 43

[56] References Cited

U.S. PATENT DOCUMENTS 5,029,175  7/1991  Ohnaka et al. ................. 372/46
5,371,756  12/1994  Fujii ............................... 372/46

FOREIGN PATENT DOCUMENTS 4-115588  4/1992  Japan .............................. 372/46

OTHER PUBLICATIONS

Haase et al, *Appl. Phys. Lett. 59(11)*, vol. 59, No. 11, pp. 1272–1274, Sep. 1991, "Blue–Green Laser Diodes".

*Primary Examiner*—Rodney B. Bovernick
*Assistant Examiner*—Yisun Song
*Attorney, Agent, or Firm*—Renner, Otto, Boisselle & Sklar

[57] ABSTRACT

An n-ZnMgSSe lower cladding layer, an n-ZnSSe light guiding layer, an undopad CdZnSe active layer, a p-ZnSSe light guiding layer, a p-ZnMgSSe upper cladding layer, and a p-ZnSe cap layer are successively formed on an n-GaAs substrate. Then, grooves and a ridge are formed in the respective p-type layers by etching. A current blocking layer formed by laminating $SiO_2$ layers and $TiO_2$ layers in multiple layers is formed so as to bury the grooves. On the top surface of the ridge where the current blocking layer is not formed, an upper electrode is formed. On the bottom surface of the n-GaAs substrate, a lower electrode is formed, and thus the ridge type semiconductor laser is fabricated. This semiconductor laser is capable of emitting blue light with an oscillating wavelength of around 500 nm. The current blocking layer of the lamination of the $SiO_2$ and $TiO_2$ layers allows effective confinement of both light and carriers and a drastic decrease in the threshold current for a laser oscillation.

29 Claims, 4 Drawing Sheets

SEMICONDUCTOR LASER AND A METHOD FOR FABRICATING THE SAME

BACKGROUND OF THE INVENTION

1. Field of the Invention

The present invention relates to a semiconductor laser and a method for fabricating the same. More particularly, the invention relates to the construction of a ridge-type semiconductor laser formed with II-VI compound semiconductor materials, capable of emitting blue light in a wavelength band from 400 to 500 nm, and a method for fabricating the same.

2. Description of the Related Art

As the materials with which semiconductor lasers are fabricated, III-V compound semiconductor materials, such as GaAs, have been generally used. Meanwhile, the recent rapid progress in the semiconductor crystal growing techniques have made it possible to grow p-type crystals of ZnSe group materials which are II-VI compound semiconductor materials, which had been believed to be impossible. As a result, the formation of PN junctions in the ZnSe group materials and the consequent fabrication of light-emitting diodes and semiconductor lasers using those materials have been reported. An advantage of the ZnSe group materials is their capability to emit blue light in a wavelength band around 500 nm.

FIG. 7 illustrates an example of a sectional structure of a conventional semiconductor laser 700 fabricated by using the II-VI compound semiconductor materials (M. A. Haase etal., "Blue-green laser diodes", Appl. Phys. Lett., Vol. 59, No. 11, pp. 1272– 1274 (9 Sep. 1991)).

In the semiconductor laser 700, an n-GaAs buffer layer 72, an $n^+$-ZnSe layer 73, an n-ZnSSe layer 74, an n-ZnSe layer 75, an undoped CdZnSe active layer 76, a p-ZnSe layer 77, a p-ZnSSe layer 78, and a $p^+$-ZnSe cap layer 79 are successively laminated in this order on an n-type GaAs substrate 71 by a Molecular Beam Epitaxy method (referred to as MBE method hereafter). A polyimide layer 80, having grooves formed in stripes, is formed and functions as a current blocking layer on the $p^+$-ZnSe cap layer 79. Further, an Au electrode 81 is formed on the top surface of the laminated multilayer structure, and an In electrode 82 is formed on the bottom surface of the n-GaAs substrate 71. The CdZnSe layer 76 used as the active layer is about 10 nm thick. The above constitution is categorized as an oxide-film striped structure.

As described previously, the Zn—Se alloys which are II-VI compound semiconductor materials are capable of emitting blue light. However, the II-VI compound semiconductor materials have properties quite different from those of the III-V compound semiconductor materials. Consequently, some of the structures and fabricating methods which have been applied to the semiconductor lasers based on the III-V compound semiconductor materials cannot be allied to semiconductor lasers based on the II-VI compound semiconductor materials.

To oscillate a semiconductor laser efficiently with a low threshold current, it is required to confine both current (injected carriers) and light simultaneously so as to obtain as high a gain as possible in a light-emitting region. From this consideration, the oxide-film striped structure shown in FIG. 7 is not sufficient in confining both current and light, resulting in insufficient laser oscillation.

The most typical structure to effectively confine current and light is the BM structure (Buried Heterostructure), in which an active layer acting as a light emitting region is embedded in other layers. The BH structure is commonly used in the semiconductor lasers based on III-V compound semiconductor materials.

For the III-V compound semiconductor lasers, the ridge type structure has also been proposed. This is made by forming a ridge in the cladding layer and filling grooves which define both sides of the ridge with an insulator layer (a current blocking layer). While the refractive index of the cladding layer is higher than 3, that of the insulator layer is below 3, for the wavelength emitted by the III-V compound semiconductor laser. This difference in the refractive index between the cladding layer end the insulator layer is utilized to confine light within a specified region.

Efficient confinement of current and light can be achieved by the use of the BH structure or the ridge type structure. However, such structures which are well applicable to the III-V compound semiconductor lasers are difficult to fabricate with the II-VI compound semiconductor materials for the reasons of the properties as described below.

First, unlike the III-V compound semiconductor materials, no II-VI compound semiconductor material allows itself to readily obtain a lattice matching, and therefore it is very difficult to form the BH structure from a combination of single crystal semiconductor materials in this group.

Secondly, the II-VI compound semiconductor materials are likely to suffer thermal deterioration when heated after epitaxial growth. On the other hand, the formation of the BH structure or the ridge type structure requires forming a mesa or a ridge after forming the DH structure, and to carry out the burying process by using another material. Consequently, the II-VI compound semiconductor materials in the DH structure has to be re-heated up to a crystal growth temperature or more. As a result, forming the BH structure or the ridge type structure with the II-VI compound semiconductor materials causes significant deterioration in the characteristics of the semiconductor materials.

Thirdly, a carrier concentration in the p-type ZnSe is around $1 \times 10^{18}$ $cm^{-3}$. This value is not sufficient for the cap layer to achieve a good ohmic contact. Therefore, contact must be done with as large a width as possible in order to reduce contact resistance and decrease the operating voltage. However, increasing the width of the mesa or the ridge in the BH structure or the ridge type structure for the purpose described above tends to bring a multiple mode laser oscillation. This makes it difficult to stabilize the laser oscillation in the basic lateral mode and increases the threshold current level.

Thus, it is very difficult to apply conventional design and fabrication processes used for the III-V compound semiconductor laser to the II-VI compound semiconductor laser.

SUMMARY OF THE INVENTION

The II-VI compound semiconductor laser of this invention includes: a semiconductor substrate; a semiconductor multilayer structure formed on the semiconductor substrate, the semiconductor multilayer structure including a lower cladding layer, an upper cladding layer and an active layer interposed between the lower and upper cladding layers; an upper electrode formed on the semiconductor multilayer structure; and a lower electrode formed on a bottom surface of the semiconductor substrate, wherein the semiconductor multilayer structure comprises a striped ridge portion, side surfaces of the striped ridge portions being covered by a current blocking layer which confines a current flowing between the upper and lower electrodes into the striped ridge portion, and the current blocking layer includes a first insulating material and a second insulating material, the first insulating material having a smaller refractive index than that of the upper cladding layer, the second insulating material having a larger refractive index than that of the upper cladding layer.

The method for fabricating a II-VI compound semiconductor laser of this invention includes the steps of: (a) forming a semiconductor multilayer structure on a semiconductor substrate, the semiconductor multilayer structure including a lower cladding layer, an upper cladding layer and an active layer interposed between the lower and upper cladding layers; (b) forming an upper electrode on the semiconductor multilayer structure; (c) forming a lower electrode on a bottom surface of the semiconductor substrate; (d) forming a striped ridge portion by etching away a portion of the semiconductor multilayer structure in a striped pattern; and (e) covering side surfaces of the striped ridge portions by a current blocking layer which confines current flowing between the upper and lower electrodes into the striped ridge portion, wherein the current blocking layer includes a first insulating material and a second insulating material, the first insulating material having a smaller refractive index than that of the upper cladding layer, the second insulating material having a larger refractive index than that of the upper cladding layer.

Thus, the invention described herein makes possible the advantages of (1) providing a semiconductor laser made of II-VI compound semiconductor materials and capable of maintaining stable single lateral mode laser oscillation, while drastically decreasing the threshold current and the operating voltage, and (2) a method for fabricating such a semiconductor laser in mass production with a good reproducibility.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples.

EXAMPLE 1

Figure 1:
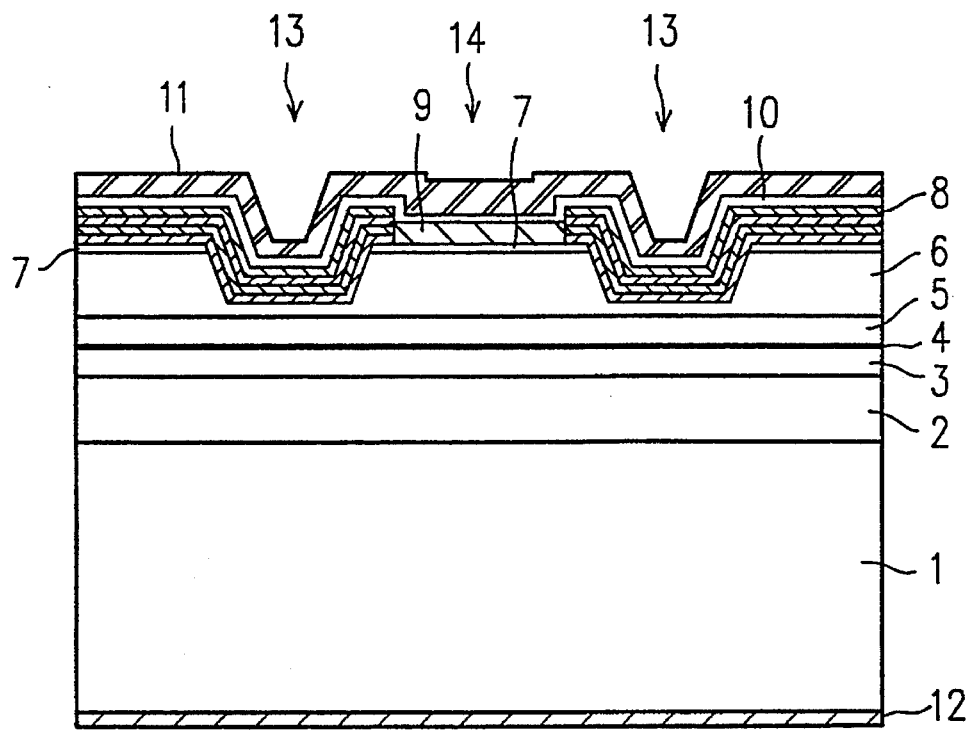
FIG. 1 is a cross-sectional diagram of a ridge type semiconductor laser in accordance with a first example of the invention.

FIG. 1 shows a sectional structure of a semiconductor laser 100 in a first example of the invention. In the semiconductor laser 100, an n-ZnMgSSe lower cladding layer 2, an n-ZnSSe light guiding layer 3, an undopad ZnCdSe active layer 4, a p-ZnSSe light guiding layer 5, a p-ZnMgSSe upper cladding layer 6, and a p-ZnSe cap layer 7 are successively formed on an n-GaAs substrate 1. Then grooves 13 and a ridge 14 are formed in the p-ZnMgSSe upper cladding layer 6 and the p-ZnSe cap layer 7 by means of chemical etching or dry etching.

Composition of the cladding layers 2 and 6 is chosen so as to obtain good lattice matching with the GaAs substrate 1. For example, in the case where the band gap energy is 3 eV, $Zn_{0.79}Mg_{0.21}S_{0.24}Se_{0.76}$ is chosen for the composition of the cladding layers 2 and 6. Similarly, composition of the light guiding layers 3 and 5 is determined so as to achieve lattice matching with the GaAs substrate 1, and to be $ZnS_{0.06}Se_{0.94}$ for a band gap energy of 3 eV. For a material of the active layer 4, ZnSe, ZnSSe and ZnCdS may be used instead of the above-mentioned ZnCdSe.

A current blocking layer 8 is formed so as to bury the grooves 13 and cover the side surfaces of the ridge 14. The current blocking layer 8 is formed by laminating $SiO_2$ layers and $TiO_2$ layers in multiple layers. The current blocking layer 8 is also formed similarly on flat surfaces except for the top surface of the ridge 14.

On the top surface of the ridge 14 where the current blocking layer 8 is not formed, an upper electrode 9 is formed. The electrode 9 may be made of, for example, Au. After forming the upper electrode 9, wiring strips of a Cr layer 10 and an Au layer 11 are formed. On the bottom surface of the n-GaAs substrate 1, on the other hand, a lower electrode 12 made of In, for example, is formed. Thus, the ridge type semiconductor laser 100 is fabricated.

The electrodes 9 and 12 and the wiring strips 10 and 11 can be formed, for example, by a vacuum deposition method or a spattering method. Methods of forming the grooves 13 and the ridge 14 and of forming the current blocking layer 8 will be described in detail later.

The current blocking layer 8 burying the grooves 13, which defines the ridge 14 formed on the cladding layer 6, is made by laminating an $SiO_2$ layer having a lower refractive index (which is 1.46 for an oscillating wavelength of 480 nm) and a $TiO_2$ layer having a higher refractive index (which is 2.8 for the same oscillating wavelength) than that of ZnMgSSe used in forming the cladding layer 6 (refractive index thereof for the same oscillating wavelength is 2.6). Current (carriers) and light are confined efficiently within the ridge 14 by this current blocking layer 8.

The above-mentioned $SiO_2$ and $TiO_2$ are both insulating materials. Thus, the current flows between the upper and lower electrodes 9 and 12 only through the ridge 14. Thus, the current (carriers) is confined.

In order to confine the carriers efficiently, the grooves may also be formed so as to reach every n-type layer below the active layer 4 by further etching. However, since the surface of the active layer 4 pears on the side surfaces of the ridge 14 in such a constitution, disadvantages such as a leakage current, due to surface recombination, and the generation of non-radiative luminescence centers tend to occur. These phenomena result in an increased threshold current level. In order to avoid such disadvantages, it is desirable to form the grooves 13 in such a manner that the bottom level thereof is above the active layer 4 so that the grooves 13 do not cross the active layer 4.

By properly controlling the thickness of the SiO₂ layer and the TiO₂ layer which constitute the current blocking layer 8 and the number of laminated layers therein, the refractive index of the current blocking layer 8 can be easily changed. This makes it possible to provide an appropriate difference in the refractive index between the upper cladding layer 6 in the ridge 14 and the current blocking layer 8. This allows control of the light confinement and laser oscillation mode. The control of the refractive index in the current blocking layer 8 can be achieved when at least one of the SiO₂ layer and the TiO₂ layer is included in two or more layers in the current blocking layer 8.

In case the current blocking layer 8 is formed only with SiO₂, getting stable laser oscillation in a single lateral mode makes it imperative to restrain the width of the ridge 14 within 500 nm. This is because the refractive indices of SiO₂ and p-ZnMgSSe used to make the upper cladding layer 6 differ too much. In such a case, a disadvantage of increase in contact resistance is induced because of insufficient carrier concentration of the p-type ZnSe group materials. However, with the grooves buried with the aforementioned current blocking layer 8 comprising the SiO₂ layers and the TiO₂ layers, stable laser oscillation in a single lateral mode can be achieved with a wider width of the ridge 14.

For example, setting the refractive index of the current blocking layer 8 to about 2.55 enables the width of the ridge 14 required to obtain stable laser oscillation in a single lateral mode to increase to about 10 μm. This can be achieved by laminating about five pairs of a 20 nm thick SiO₂ and 80 nm thick TiO₂ layers, given such conditions as the thickness ratio of the SiO₂ layer and the TiO₂ layer being 1:4 and the laser oscillation occurring at a wavelength around 500 nm.

The refractive index of the current blocking layer 8 may be either larger or smaller than that of the upper cladding layer 6.

As described above, the ridge type semiconductor laser 100 of the invention shown in FIG. 1, in which the grooves 13 are buried with the SiO₂/TiO₂ current blocking layer 8, is capable of efficiently confining both light and carriers, which leads to a drastic decrease in the threshold current level required for laser oscillation. Further, the constitution of the invention allows the width of the ridge 14 to be widened. As a result, although p-type II-VI compound semiconductor materials having contact resistance a little higher than that of III-V compound semiconductor materials is used, contact resistance can be decreased by making the width of the ridge 14 wider and thereby increasing the contact portion between the ridge 14 and the upper electrode 8. This results in a reduced operating voltage.

Moreover, the semiconductor laser 100 in this example is capable of emitting a blue light, which oscillates in a wavelength band from 400 to 500 nm in a stable single lateral mode with a low threshold current. These features of the semiconductor laser 100 make it applicable in a various range of applications, such as light sources for an optical disk or a laser beam printer. Such semiconductor lasers can be produced with good reproducibility, yield of production can be improved and the manufacturing cost can be decreased in mass production.

By properly controlling the thickness of the SiO₂ layer and the TiO₂ layer which constitute the current blocking layer 8 and the number of laminated layers therein, the refractive index of the current blocking layer 8 can be easily changed. Thus, the grooves 13 can be formed even inside the p-type cladding layer 6 and/or the light guiding layer 5 and thereby the far field pattern of the emitted light can be controlled. Furthermore, in some applications of the semiconductor laser, it is sometimes required to intentionally weaken the degree of light confinement to some extent so that an appropriate amount of light is released. The semiconductor laser of the invention can be easily modified depending on applications through controlling the refractive index of the current blocking layer 8.

In the ridge type semiconductor laser 100, the ridge 14 is typically 5 to 10 μm wide so as to obtain a sufficiently low operating voltage, while the grooves 13 are 2 to 3 μm wide. In order to maximize the optical confinement factor in the direction of layer thickness with the active layer 4 having a thickness of 10 μm, it is required that the light guiding layers 3 and 5 have thickness of about 90 nm.

In the above explanation, SiO₂ and TiO₂ are used as the materials of the current blocking layer 8. Alternatively, other combination of materials may be used. For example, any one of an AlN layer, an Al₂O₃ layer and an Si₃N₄ layer may be combined with the TiO₂ layer instead of the SiO₂ layer so as to form the current blocking layer 8. Furthermore, an additional third insulating material having a different refractive index from those of the aforementioned two materials may be further included in the current blocking layer 8. These aspects can also be applied in the following second and third examples of the invention.

In the configuration of the semiconductor laser 100 in FIG. 1, flat portions are formed, which are substantially at the same level as the top surface of the ridge 14. These flat portions are used so as to enlarge a mounting region in an up-side down mounting of the semiconductor laser 100, thus preventing an excess stress from being applied to the ridge 14. Damages to the fragile II-VI compound semiconductor materials during fabricating processes are thus avoided. Alternatively, the flat portions are not requisite for the invention and may be omitted, for example in an up-side up mounting, as long as the side surfaces of the ridge 14 are covered by the current blocking layer 8. This feature is also applied to the following other examples of the invention.

EXAMPLE 2

A second example of the invention will be described below with reference to FIG. 2.

Figure 2:
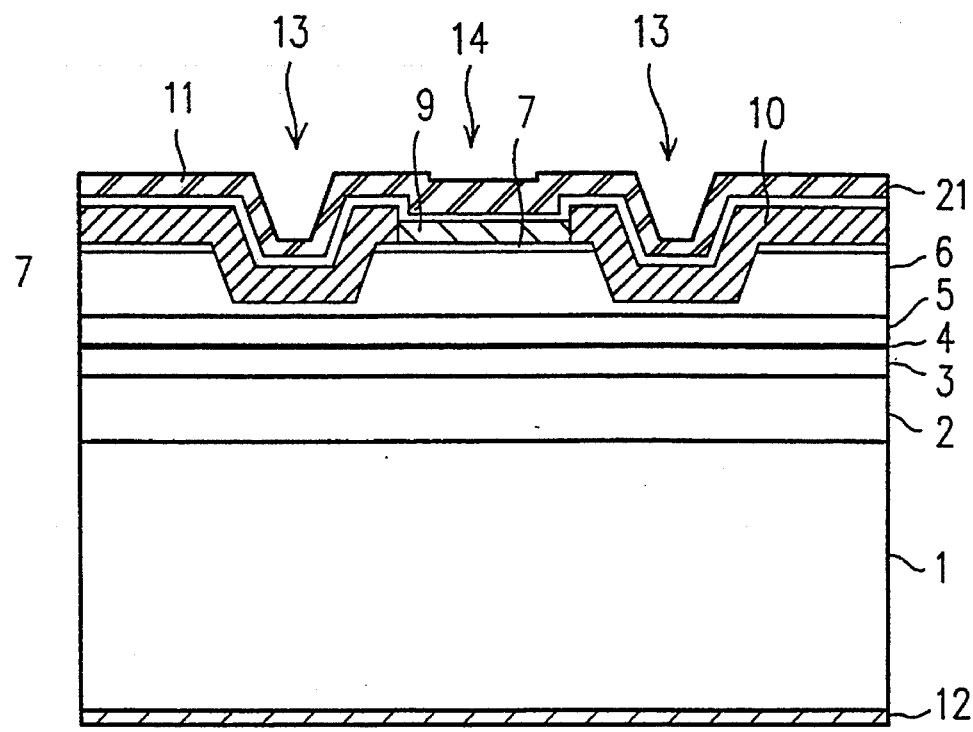
FIG. 2 is a cross-sectional diagram of a ridge type semiconductor laser in accordance with a second example of the invention.

Major constitution of the semiconductor laser 200 of the second example shown in FIG. 2 is similar to that of the semiconductor laser 100 of the first example shown in FIG. 1. The same reference numerals as used in FIG. 1 are used to designate like layers in FIG. 2, and therefore detailed description thereof will be omitted.

The semiconductor laser 200 differs from the semiconductor laser 100 in that the current blocking layer 21 is formed by a mixture of SiO₂ and TiO₂, instead of lamination of SiO₂ layers and TiO₂ layers. In the semiconductor laser 100 of the first example, in order to obtain a desired refractive index, it is required to control the thickness of the SiO₂ layers and the TiO₂ layers which constitute the current blocking layer 8 and the total number of laminated layers therein. In the semiconductor laser 200 of the second example, on the other hand, a desired refractive index can be obtained by controlling only the mixed proportion of SiO₂ and TiO₂ which constitute the current blocking layer 21. Thickness of the current blocking layer 21 need not be precisely controlled, and only needs to have an appropriate thickness. By adjusting the mixed proportion of SiO₂ and TiO₂, it is made possible to continuously change the refractive index of the current blocking layer 21 from 1.46 to 2.8.

For example, when the grooves 13 are buried with the current blocking layer 21 having the refractive index of 2.55, obtained by mixing $SiO_2$ and $TiO_2$ in a ratio of 1:4, the width of the ridge 14 required to obtain stable laser oscillation in a single lateral mode can be broadened up to about 10 pm, similarly to the first example. Since both light and carriers are confined efficiently, it is made possible to drastically decrease the threshold current level required for laser oscillation. In addition, other advantages similar to those described in relation to the first example can also be obtained in this example.

EXAMPLE 3

A third example of the invention will be described below with reference to FIG. 3.

Figure 3:
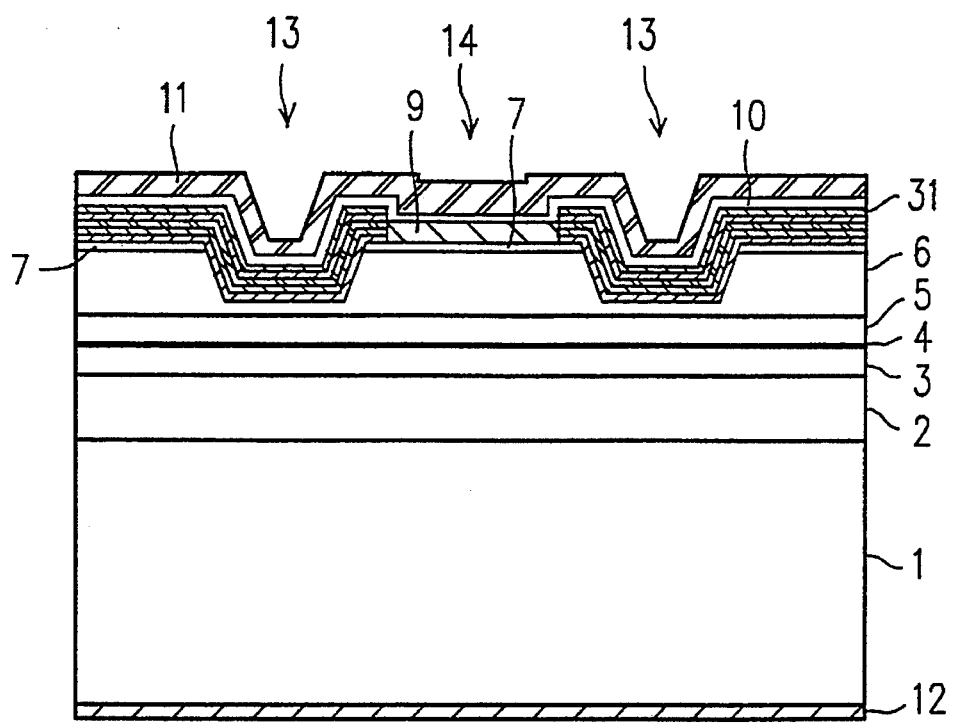
FIG. 3 is a cross-sectional diagram of a ridge type semiconductor laser in accordance with a third example of the invention.

Major constitution of the semiconductor laser 300 of the third example shown In FIG. 3 is similar to that of the semiconductor laser 100 of the first example shown in FIG. 1 and that of the semiconductor laser 200 of the second example shown in FIG. 2. The same reference numerals as used in FIGS. 1 and 2 are used to designate like layers in FIG. 3, and therefore detailed description thereof will be omitted.

The semiconductor laser 300 differs from the semiconductor laser 100 and the semiconductor laser 200 in that a light absorbing layer which absorbs light emitted from the active layer is further provided in the current blocking layer 31 formed by laminating the $SiO_2$ layers and the $TiO_2$ layers. The light absorbing layer may be formed as a very thin metal film, such as a thin Al film. Since the light absorbing layer absorbs light, it is made possible to control not only the refractive index of the current blocking layer 31 but also the attenuation coefficient thereof, thereby realizing an anti-index guided semiconductor laser.

Providing the light absorbing layer in the current blocking layer 31 allows light to be confined more effectively in the ridge 14 than in the semiconductor lasers 100 and 200 described in conjunction with the first and the second examples. A width of the ridge 14 can be increased up to about 10 μm, similar to the previous examples. In addition, since both light and carriers are confined efficiently, it is made possible to drastically decrease the threshold current level required for laser oscillation.

EXAMPLE 4

A method of fabricating the semiconductor laser of the invention will be described below as the fourth example of the invention.

First, an n-$Zn_{1-x}Mg_xS_ySe_{1-y}$ lower cladding layer 2 (1 μm thick), an n-$ZnS_{0.06}Se_{0.94}$ light guiding layer 3 (0.15 μm thick), an undopad $Cd_{0.2}Zn_{0.8}Se$ active layer 4 (0.012 μm thick), a p-$ZnS_{0.06}Se_{0.94}$ light guiding layer 5 (0.15 μm thick), a p-$Zn_{1-x}Mg_xS_ySe_{1-y}$ upper cladding layer 6 (1 μm thick), and a p-ZnSe cap layer 7 (0.1 μm thick) are successively laminated on an n-GaAs substrate 1. Values of x and y in the composition of the cladding layers 2 and 6 are chosen so that the band gap energy becomes 2.9 eV or higher while maintaining lattice matching with the GaAs substrate 1. For example, in a case where the band gap energy is 3 eV, x becomes 0.21 and y becomes 0.24.

Figure 4A:
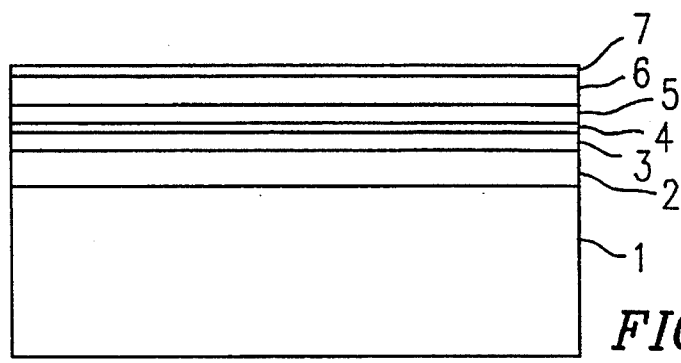
FIGS. 4A through 4D are cross-sectional diagrams illustrative of the fabricating process of the semiconductor laser in accordance with the invention.
Figure 4B:
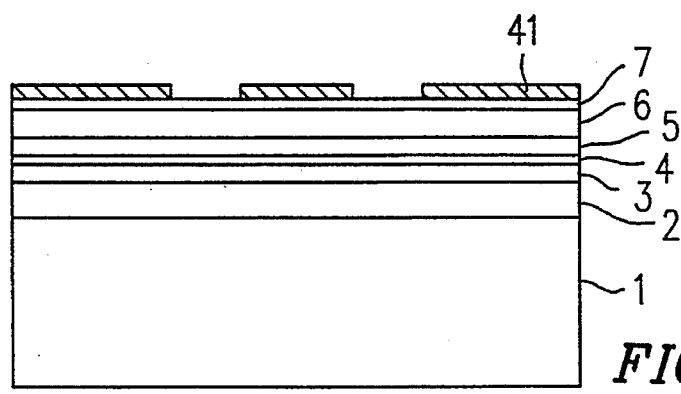

Then an $SiO_2$ layer 41 which is 0.3 μm thick is formed on the p-ZnSe cap layer 7 by an optical CVD method. This is followed by the application of a photoresist and the formation of stripes by means of a mask having a striped pattern. Then after development process, portions of the $SiO_2$ layer 41 are removed in the striped pattern by means of an etching solution prepared by mixing a hydrofluoric acid and an ammonium fluoride in proportion of 1:10. The resultant configuration is shown in FIG. 4B.

Figure 4C:
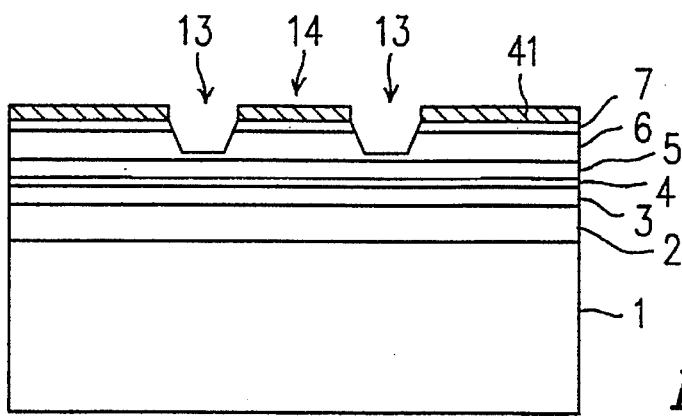

Next, the p-ZnSe cap layer 7 and the p-ZnMgSSe upper cladding layer 6 are partially etched away by using the striped $SiO_2$ layer as the etching mask and an etching solution prepared by mixing a potassium dichromate and a sulfuric acid in a proportion of 3:2, as shown in FIG. 4C. Assuming that the etching temperature is 40° C., the etching rate becomes 550 nm/min. The etching rate in this etching process can be well controlled, and the grooves 13 which are 900 nm deep can be formed by etching for 100 seconds. The width of the ridge 14 can be controlled by changing the spacing between the stripes of the mask described in conjunction with FIG. 4B. Similarly, a configuration in which there are no grooves 13 and flat portions on both right-hand and left-hand regions of the ridge 14 can be formed by changing the configuration of the mask.

Figure 4D:
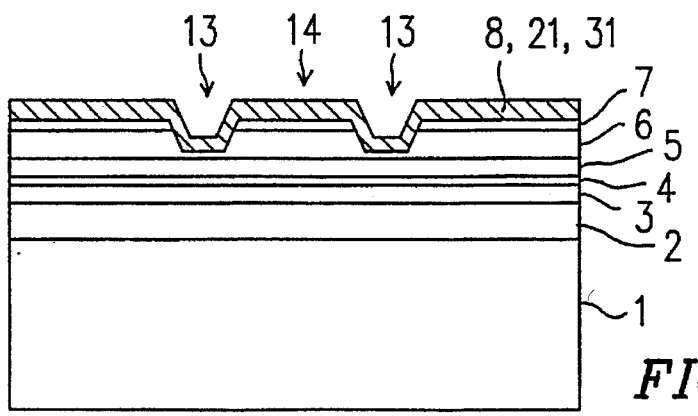

After forming the grooves 13 and the ridge 14 as described above, the $SiO_2$ layer 41 is etched away by using a etching solution which is a mixture of a hydrofluoric acid and an ammonium fluoride. This is followed by the formation of either the current blocking layer 8, 21 or 31 described in the first to third examples to cover all the top surface of the semiconductor laser including the grooves 13 by way of, for example, a process to be described later. The resultant configuration is illustrated in FIG. 4D.

The thus formed current blocking layer is partially removed from over the ridge 14 by a photolithography technique, and an Au layer to serve as a top electrode (not shown in FIGS. 4A to 4D) is deposited instead. Then the photoresist and a portion of the Au layer located on the photoresist are removed and wiring layers (a Cr layer and an Au layer, neither are shown in FIGS. 4A and 4D) are deposited instead. The semiconductor lasers 100, 200 and 300 described in the first through the third examples are fabricated in the above processes.

It is necessary to install a lower electrode (not shown in FIGS. 4A–4D) on the bottom surface of the n-GaAs substrate 1 by an appropriate method. In this case, the in electrode described in the above examples can be easily obtained in the case where in used as a lining material during MBE growth is left to remain and serve as the electrode material.

Figure 5:
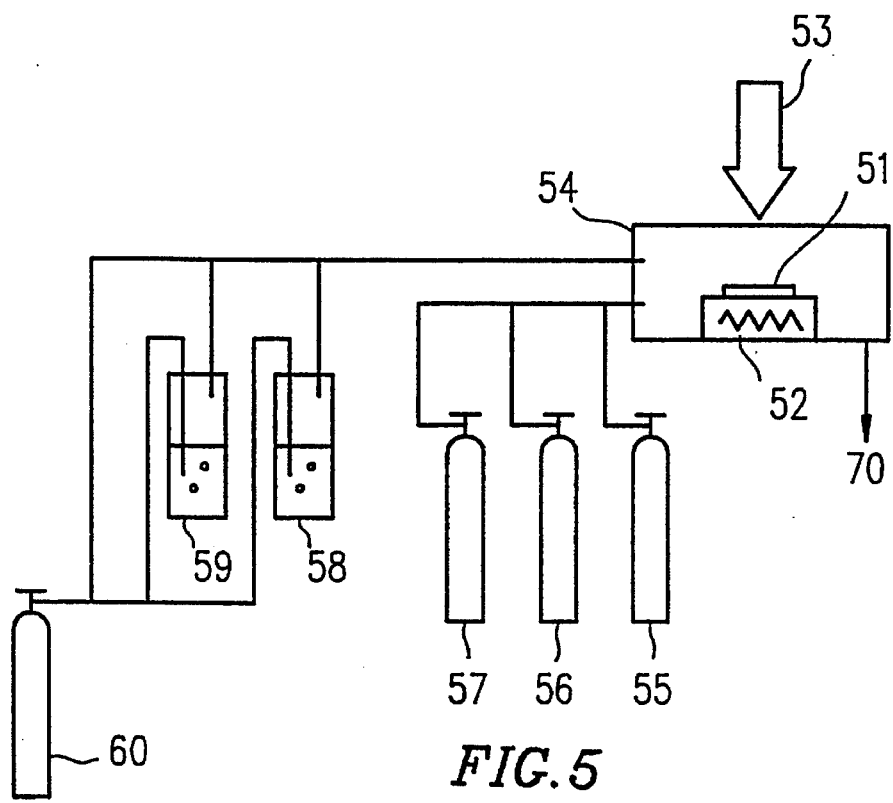
FIG. 5 is a schematic diagram illustrative of an optical CVD apparatus used in fabrication of the ridge type semiconductor laser of the invention.

Now a method of forming the current blocking layers 8 and 21 will be described below with reference to FIG. 5.

A wafer 51 is placed on a heater 52 in a reactor 54. An arrangement is provided such that the wafer 51 is irradiated with ultraviolet rays 53 from the outside. The reactor 54 is provided with pipes to introduce various gases into the reactor 54. Gases to be introduced include $SiH_4$ gas 55 and $O_2$ gas 56 used to form the $SiO_2$ layer, $N_2$ gas 57 as a carrier gas, $TiCl_4$ gas 58 and $H_2O$ 59 used to form the $TiO_2$ film and $N_2$ gas 60 as a carrier gas.

During the process of forming the current blocking layer, temperature of the wafer 51 is maintained at 200° C. by means of the heater 52. In order to form the current blocking layer 8 including a plurality of the $SiO_2$ layers and the $TiO_2$ layers alternately laminated, the $TiO_2$ layer, for example, having a larger refractive index is first formed to a thickness of 50 nm. Vapor pressures of the $TiCl_4$ gas 58 and $H_2O$ 59 in this stage are controlled by means of a thermostat chamber. Flow rates of the $TiCl_4$ gas 58 and $H_2O$ 59 being introduced into the reactor 54 is controlled through precise control of the flow rate of the carrier gas used in bubbling by means of a mass flow controller. When temperatures of the TiCl$_4$ gas 58 and H$_2$O 59 are respectively set to 30° C. and 70° C. and the respective flow rates of the carrier gases are set to 10 cc/min and 90 cc/min while being irradiated by ultraviolet rays 53, a growth rate of the TiO$_2$ layer becomes 10 nm/min. This means that the TiO$_2$ layer of a 50 nm thickness can be obtained in 5 minutes by this process.

Then, the pipes to introduce the gases into the reactor 54 are switched for the SiO$_2$ layer formation. The SiH$_4$ gas 55 and the O$_2$ gas 56 are introduced into the reactor 54 both at a flow rate of 100 cc/min together with the N$_2$ gas 57 as the carrier gas at a flow rate of 200 cc/min, while being irradiated by ultraviolet rays 53. Under these flow rate condition, a growth rate for the SiO$_2$ layer becomes 10 nm/min, and consequently a 10 nm thick SiO$_2$ layer is formed by one minute of processing.

The processes of forming the SiO$_2$ layer and the TiO$_2$ layer are repeated 10 times respectively so as to build the current blocking layer of 600 nm in total thickness. The refractive index for light of wavelength 500 nm in the thus formed current blocking layer is slightly lower than that of p-ZnMgSSe which constitutes the upper cladding layer 6. As a result, light is confined untightly in the lateral direction, and stable laser oscillation in a single lateral mode is obtained even when the ridge 14 is made as wide as 10 µm. By controlling the thickness of the SiO$_2$ layer and the TiO$_2$ layer and the number of laminated layers, the refractive index of the current blocking layer can be changed continuously from 1.46 to 2.8.

Figure 6:
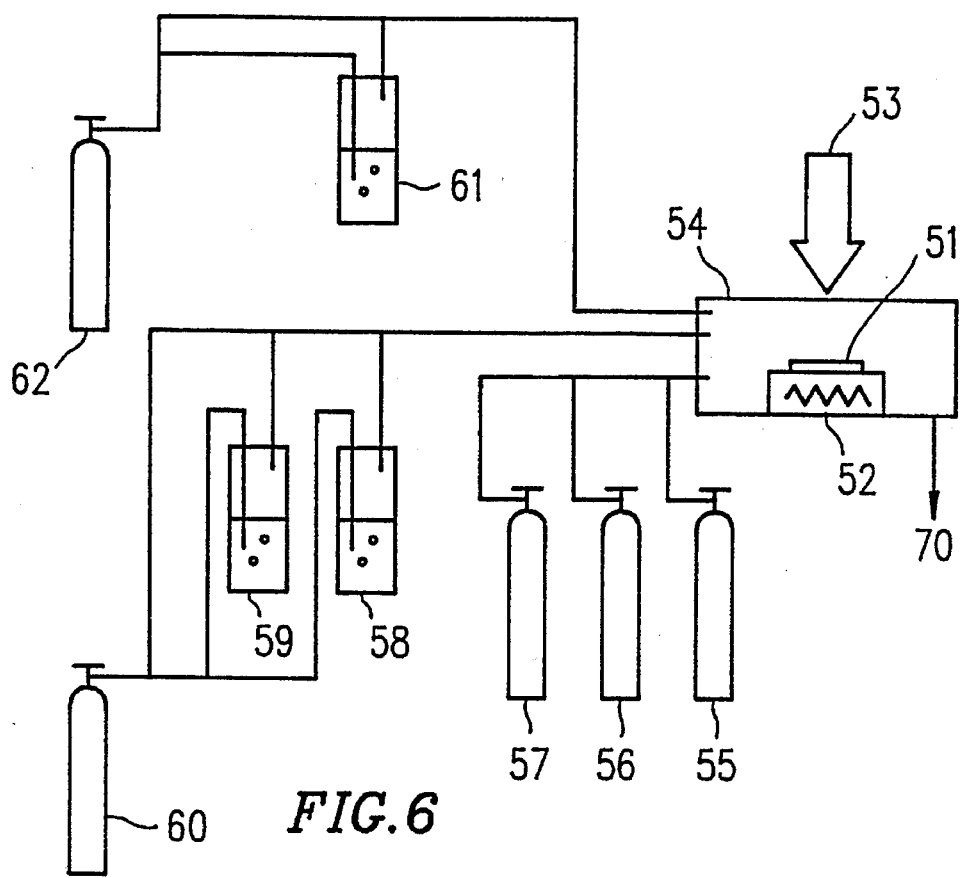
FIG. 6 is a schematic diagram illustrative of an optical CVD apparatus used in fabrication of the ridge type semiconductor laser of the invention.
Figure 7:
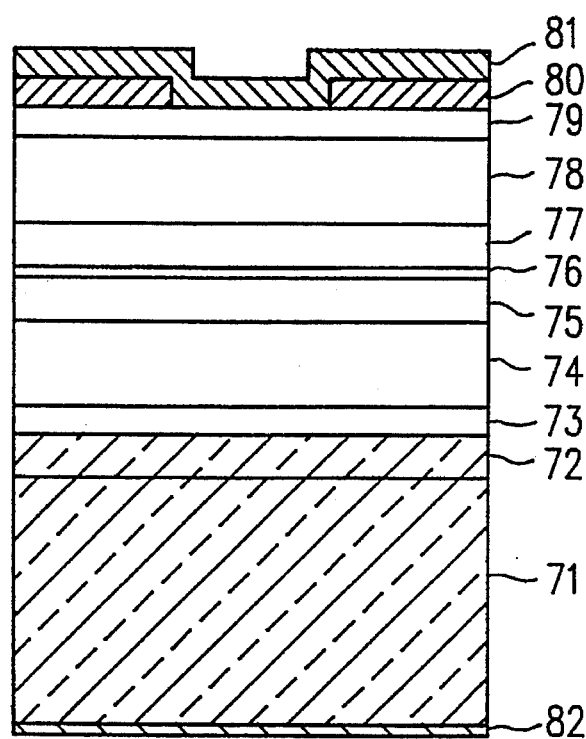
FIG. 7 is a sectional diagram illustrative of an example of the constitution of a conventional semiconductor laser.

Alternatively, in order to form a thin metal film, which functions as a light absorbing layer, more specifically a thin Al film, in the current blocking layer 31 as in the third example, it suffices to introduce trimethylaluminium (referred to as TMA hereinafter) 61, which is an organic metal compound, into the reactor 54 together with the carrier gas of H$_2$ gas as shown in FIG. 6. The same reference numerals as used in FIG. 5 are used to designate lake constituents in FIG. 6 and therefore description thereof is omitted.

In this process, temperature of the wafer 51 is set to 200° C. Although this temperature is a little lower than that usually required to form the Al layer, a good thin film of Al can be formed when assisted by the irradiation of ultraviolet rays 53 and the increased amount of TMA 61 to be introduced.

The current blocking layer is formed by the optical CVD method, in which the CVD process is assisted by ultraviolet radiation, in the process described above. This intends to enable crystal growth at a low temperature. In other words, the layers are obtained without thermal deterioration, while the current blocking layer is grown after forming the DH structure. Alternatively, other methods, for example a sputtering process or an EB deposition, may also be employed, provided that the current blocking layer can be grown at a temperature below the crystal growing temperature of the II-VI compound semiconductor materials.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A II-VI compound semiconductor laser, comprising:
    a semiconductor substrate;
    a semiconductor multilayer structure formed on the semiconductor substrate, the semiconductor multilayer structure including a lower cladding layer, an upper cladding layer and an active layer interposed between the lower and upper cladding layers;
    an upper electrode formed on the semiconductor multilayer structure; and
    a lower electrode formed on a bottom surface of the semiconductor substrate,
    wherein the semiconductor multilayer structure comprises a striped ridge portion, side surfaces of the striped ridge portions being covered by a current blocking layer which confines current flowing between the upper and lower electrodes into the striped ridge portion, and
    the current blocking layer includes a first insulating material and a second insulating material, the first insulating material having a smaller refractive index than that of the upper cladding layer, the second insulating material having a larger refractive index than that of the upper cladding layer.

2. A semiconductor laser according to claim 1, wherein the current blocking layer further includes other insulating material having a different refractive index from those of either of the first and second insulating materials.

3. A semiconductor laser according to claim 1, wherein the current blocking layer is formed by a mixture of the first insulating material and the second insulating material.

4. A semiconductor laser according to claim 1, wherein the current blocking layer is formed by laminating a first insulating layer made of the first insulating material and a second insulating layer made of the second insulating material.

5. A semiconductor laser according to claim 4, wherein a laminated number of at least one of the first insulating layer and the second insulating layer is two or more.

6. A semiconductor laser according to claim 1, wherein the first insulating material is a material selected from a group consisting of SiO$_2$, AlN, Al$_2$O$_3$ and Si$_3$N$_4$, and the second insulating material is TiO$_2$.

7. A semiconductor laser according to claim 1, wherein
    the semiconductor multilayer structure comprises flat portions in both right-hand and left-hand regions of the striped ridge portions, a level of the flat portions being substantially equal to a level of the striped ridge portion, and
    grooves are formed between the respective flat portions and the striped ridge portion, a bottom level of the grooves being located at a higher level than the active layer, the grooves being buried with the current blocking layer.

8. A semiconductor laser according to claim 4, wherein the current blocking layer further comprises a light absorbing layer which absorbs light emitted from the active layer.

9. A semiconductor laser according to claim 8, wherein the light absorbing layer is formed of a thin metal film.

10. A semiconductor laser according to claim 1, wherein
    the semiconductor substrate is formed of GaAs,
    the active layer is formed of a material selected from a group consisting of ZnSe, ZnSSe, ZnCdS and ZnCdSe, and
    the upper and lower cladding layers are formed of ZnMgSSe.

11. A semiconductor laser according to claim 10, wherein the semiconductor multilayer structure further comprises:
    a lower light guiding layer interposed between the lower cladding layer and the active layer; and
    an upper light guiding layer interposed between the upper cladding layer and an active layer, the upper and lower light guiding layers being formed of ZnSSe.

12. A method for fabricating a II-VI compound semiconductor laser, comprising the steps of:

(a) forming a semiconductor multilayer structure on a semiconductor substrate, the semiconductor multilayer structure including a lower cladding layer, an upper cladding layer and an active layer interposed between the lower and upper cladding layers;

(b) forming an upper electrode on the semiconductor multilayer structure;

(c) forming a lower electrode on a bottom surface of the semiconductor substrate;

(d) forming a striped ridge portion by etching away a portion of the semiconductor multilayer structure in a striped pattern; and (e) covering side surfaces of the striped ridge portions with a current blocking layer which confines a current flowing between the upper and lower electrodes into the striped ridge portion, wherein the current blocking layer includes a first insulating material and a second insulating material, the first insulating material having a smaller refractive index than that of the upper cladding layer, the second insulating material having a larger refractive index than that of the upper cladding layer.

13. A method for fabricating a semiconductor laser according to claim 12, wherein the current blocking layer further includes other insulating material having a different refractive index from those of either of the first and second insulating materials.

14. A method for fabricating a semiconductor laser according to claim 12, wherein the current blocking layer is formed of a mixture of the first insulating material and the second insulating material.

15. A method for fabricating a semiconductor laser according to claim 12, wherein the current blocking layer is formed by laminating a first insulating layer made of the first insulating material and a second insulating layer made of the second insulating material.

16. A method for fabricating a semiconductor laser according to claim 15, wherein a laminated number of at least one of the first insulating layer and the second insulating layer is two or more.

17. A method for fabricating a semiconductor laser according to claim 12, wherein the first insulating material is a material selected from a group consisting of $SiO_2$, AlN, $Al_2O_3$ and $Si_3N_4$, and the second insulating material is $TiO_2$.

18. A method for fabricating a semiconductor laser according to claim 12, wherein the striped ridge portions are formed such that the semiconductor multilayer structure comprises flat portions in both right-hand and left-hand regions of the striped ridge portions, a level of the flat portions being substantially equal to a level of the striped ridge portion, and grooves are formed between the respective flat portions and the striped ridge portion, a bottom level of the grooves being located at a higher level than the active layer, the grooves being buried with the current blocking layer.

19. A method for fabricating a semiconductor laser according to claim 18, wherein the grooves in the semiconductor multilayer structure are buried by the current blocking layer.

20. A method for fabricating a semiconductor laser according to claim 12, further comprising the step of forming a light absorbing layer in the current blocking layer, the light absorbing layer absorbing light emitted from the active layer.

21. A method for fabricating a semiconductor laser according to claim 20, wherein the light absorbing layer is formed by a thin metal film.

22. A method for fabricating a semiconductor laser according to claim 12, wherein the semiconductor substrate is formed of GaAs, the active layer is formed of a material selected from a group consisting of ZnSe, ZnSSe, ZnCdS and ZnCdSe, and the upper and lower cladding layers are formed of ZnMgSSe.

23. A method for forming a semiconductor laser according to claim 22, further comprising the steps of:

forming a lower light guiding layer interposed between the lower cladding layer end the active layer; and forming an upper light guiding layer interposed between the upper cladding layer and an active layer, the upper and lower light guiding layers being formed by ZnSSe.

24. A method for forming a semiconductor laser according to claim 12, wherein in step (d), an etching solution of a mixture of potassium dichromate and sulfuric acid mixed at a predetermined proportion is used.

25. A method for fabricating a semiconductor laser according to claim 24, wherein the predetermined proportion is a proportion of the potassium dichromate and the sulfuric acid 3:2, and an etching temperature is set to be 40° C.

26. A method for fabricating a semiconductor laser according to claim 12, wherein in step (e), the current blocking layer is formed by a photo CVD method which utilizes an introduction of predetermined gases into a reactor and an irradiation by UV rays.

27. A method for fabricating a semiconductor laser according to claim 26, wherein the first insulating material included in the current blocking layer is $SiO_2$ the first insulating material being formed by the photo CVD method with silane and $O_2$ as the predetermined gases.

28. A method for fabricating a semiconductor laser according to claim 26 wherein the second insulating material included in the current blocking layer is $TiO_2$, the second insulating material being formed by the photo CVD method with $TiCl_4$ and $H_2O$ as the predetermined gases.

29. A method for fabricating a semiconductor laser according to claim 26, wherein the current blocking layer further comprises a thin metal layer, the thin metal layer being formed by the photo CVD method with an organic metal compound and $H_2$ as the predetermined gases.

* * * * *